(12) United States Patent
Nanshan (10) Patent No.: US 10,295,574 B2
(45) Date of Patent: May 21, 2019

(54) CLIP-ON CURRENT TRANSDUCER OR CURRENT TRANSFORMER

(71) Applicant: LEM INTELLECTUAL PROPERTY SA, Fribourg (CH)

(72) Inventor: Ye Nanshan, Beijing (CN)

(73) Assignee: LEM INTELLECTUAL PROPERTY SA, Fribourg (CH)

( * ) Notice: Subject to any disclaimer, the term of this patent is extended or adjusted under 35 U.S.C. 154(b) by 36 days.

(21) Appl. No.: 15/025,816

(22) PCT Filed: Sep. 26, 2014

(86) PCT No.: PCT/IB2014/064849
§ 371 (c)(1),
(2) Date: Mar. 29, 2016

(87) PCT Pub. No.: WO2015/044899
PCT Pub. Date: Apr. 2, 2015

(65) Prior Publication Data
US 2016/0231362 A1 Aug. 11, 2016

(30) Foreign Application Priority Data

Sep. 30, 2013 (EP) .................................... 13186759

(51) Int. Cl.
*G01R 15/18* (2006.01)
*H01F 27/02* (2006.01)
(Continued)

(52) U.S. Cl.
CPC ......... *G01R 15/186* (2013.01); *G01R 15/185* (2013.01); *H01F 27/02* (2013.01);
(Continued)

(58) Field of Classification Search
CPC .. G01R 15/181; G01R 19/0092; G01R 15/18; G01R 15/183; G01R 15/186
(Continued)

(56) References Cited

U.S. PATENT DOCUMENTS

| 1,924,039 A | * | 8/1933 | Hockley | ................... | G01R 5/14 |
| | | | | | 324/127 |
| 2,783,437 A | * | 2/1957 | Yenni | ....................... | G01R 1/22 |
| | | | | | 324/127 |

(Continued)

FOREIGN PATENT DOCUMENTS

| EP | 1617228 A1 | 1/2006 |
| EP | 2083277 A1 | 7/2009 |

(Continued)

OTHER PUBLICATIONS http://www.tamuracorp.com/uploads/currentsensor/ClosedlloopPDF.pdf Tamura Corporation of America www.tamuracorp.com 1040 South Andreasen Dr. Ste 100 Escondido, CA 92029 pp. 1-16. 1-800-472-6624.*

(Continued)

*Primary Examiner* — Christopher P McAndrew
(74) *Attorney, Agent, or Firm* — Faegre Baker Daniels LLP (57) ABSTRACT

Electrical current transducer for mounting around an electrical primary conductor carrying a current to be measured, comprising a primary conductor receiving aperture (16), a housing (4), a magnetic core (6) mounted in the housing, and a secondary coil (10) wound around a branch of the magnetic core. The housing comprises a major portion (4a) and a minor portion (4b), the major portion being separable from the minor portion and configured to be mounted and locked around the primary conductor, the housing major and minor portions joinable together at joining faces (32a, 36a). The magnetic core comprises a major portion (6a) mountable in (Continued)

a core receiving cavity (20) of the housing major portion (4a), and a minor portion (6b) mountable in a core receiving cavity (22) of the housing minor portion (4b). The housing further comprises an electrical component support body (4c) comprising a coil support portion (28) around which the secondary coil is mounted, the secondary coil and coil support portion being received in a first branch receiving portion (20a) of the core receiving cavity of the housing major portion (4a), the coil support portion comprising a core receiving cavity (26) comprising a first branch receiving portion (26a) receiving a first branch (7a) of the magnetic core major portion (6a) therein, a longitudinal axis (A) of the magnetic core first branch (7a) being in a transverse direction to the general direction of the joining faces (32a, 36a).

14 Claims, 6 Drawing Sheets (51) Int. Cl.
  *H01F 27/24* (2006.01)
  *H01F 38/30* (2006.01)
(52) U.S. Cl.
  CPC ............ *H01F 27/24* (2013.01); *H01F 38/30* (2013.01); *G01R 15/183* (2013.01)
(58) Field of Classification Search
  USPC ......................................................... 324/127
  See application file for complete search history.

(56) References Cited

U.S. PATENT DOCUMENTS

| | | | | |
|---|---|---|---|---|
| 2,834,941 | A * | 5/1958 | Hickok, Jr. | G01R 1/22 324/127 |
| 3,213,365 | A * | 10/1965 | Wilson | G01R 1/22 324/115 |
| 3,553,574 | A * | 1/1971 | Rice et al. | G01R 27/2605 324/127 |
| 3,706,032 | A * | 12/1972 | Vikstrom | G01R 1/22 324/117 R |
| 3,984,798 | A * | 10/1976 | Bussen | H01F 38/30 336/176 |
| 4,005,380 | A * | 1/1977 | Heilmann | G01R 1/22 324/127 |
| 4,071,824 | A * | 1/1978 | Kernander | G01R 1/22 324/127 |
| 4,316,142 | A * | 2/1982 | Kuramoto | G01R 1/22 324/127 |
| 4,378,525 | A * | 3/1983 | Burdick | G01R 1/22 324/117 R |
| 4,518,913 | A * | 5/1985 | Jackson | G01R 1/22 324/117 H |
| 4,728,887 | A * | 3/1988 | Davis | G01R 15/14 324/127 |
| 5,039,970 | A * | 8/1991 | Cox | G01R 1/22 324/127 |
| 5,140,257 | A * | 8/1992 | Davis | G01R 15/14 324/106 |
| 9,198,500 | B2 * | 12/2015 | Davis | A46B 9/028 |
| 9,372,207 | B1 * | 6/2016 | Brouwer | G01R 21/06 |
| 9,804,201 | B2 * | 10/2017 | Young | G01R 15/18 |

FOREIGN PATENT DOCUMENTS

| | | |
|---|---|---|
| JP | 2010232389 | 10/2010 |
| JP | 2013044532 | 3/2013 |
| JP | 2013179233 A | 9/2013 |

OTHER PUBLICATIONS

International Search Report and Written Opinion issued by the European Patent Office, dated Jan. 28, 2015, for International Application No. PCT/IB2014/064849; 10 pages.

* cited by examiner

CLIP-ON CURRENT TRANSDUCER OR CURRENT TRANSFORMER

The present invention relates to an electric current transducer or an electric current transformer comprising a magnetic core and a secondary coil mounted in a housing, whereby the housing and magnetic core can be split open to allow mounting and closing of the transducer around a primary conductor.

Electrical current transducer modules for current sensing applications typically comprise a magnetic core made of a high permeability magnetic material, surrounding a central aperture through which passes a primary conductor carrying the current to be measured. The magnetic core may typically have a generally rectangular or circular shape and, depending on the configuration, may be provided with an air-gap in which a magnetic field detector, such as a Hall effect sensor in the form of an ASIC, or a fluxgate sensor, is positioned. The magnetic flux generated by the electrical current flowing in the primary conductor is concentrated by the magnetic core and is representative of the primary current. In current sensors of the closed-loop type the magnetic field sensor is connected in a feed-back loop to a compensation coil, also generally called a secondary coil, that is typically wound around a portion of the magnetic core in order to generate a compensation current that tends to cancel the magnetic field generated by the primary conductor. The compensation current thus represents an image of the current to be measured. Secondary coils are also employed in current transducers of the open-loop type, but as pick-up coils that measure the magnetic field concentrated in the magnetic core in a transformer effect.

An electric current transformer can be thought of as a closed-loop current transducer without electronics. By reference to the generic term "current transducer" herein it is also meant to encompass current transformers, which may be considered to be a particular form of current transducer.

In certain applications, the current transducer needs to be mounted around the primary conductor, for instance where the primary conductor is in the form of a cable that should not be cut. In such applications, the cable cannot be inserted through a closed annular core and therefore the annular core must be split such that it can be opened, mounted around the primary conductor and then closed. Current transducers of this type are known and typically comprise a two-part housing connected by a pivotable hinge, each housing part comprising a portion of the magnetic core. Typically, one of the housing portions comprises a U-shaped soft magnetic core, and in the other housing part hinged thereto, is positioned either a U-shaped soft magnetic core or a straight beam soft magnetic core that extends between and connects the ends of the U-shaped core when the transducer is closed. For current transducers comprising a secondary coil, the coil is typically mounted around the central branch of the U-shaped core.

The housing portion incorporating the secondary coil and U-shaped core constitutes the principal bulk of the current transducer and comprises a cable or connector portion for the measurement signal output and power. The other housing part is hinged to the major part and is pivoted open to allow the primary conductor, such as a cable, to be placed in a recess in the housing, the lid then being swiveled to the close position and held typically by a clip or other fastening means.

In many situations, access to the primary conductor is difficult and the space available for mounting a current transducer may be very tight. Also, primary conductor cables may be rigid or have only a very limited degree of flexibility such that the compactness and ease of opening and closing the current transducer around the primary conductor are of importance. Moreover, in certain applications primary conductors may have high voltages that require the electrical current transducer to have a high creepage resistance to avoid electrical leakage or breakdown between the primary conductor, the magnetic core and the secondary coil. In conventional split core current transducers, the aperture through which the primary conductor extends may not be well separated from the apertures in the housing necessary for insertion of the magnetic core parts in the housing. In such conventional split core transducers, in order to guarantee minimum creepage distances for high voltage applications, the circumference of the magnetic core is often increased beyond the required minimum, thus increasing the bulk of the transducer.

Electrical current sensors are used in a large variety of applications for monitoring or controlling electrical devices and systems. In many applications there is an important advantage in reducing the manufacturing cost of such components and also the costs of implementing and using the components in an electrical circuit. There is often also an important advantage in providing compact components in order to miniaturize and/or reduce the weight of the devices in which the components are mounted.

A compact current sensor with integrated primary conductors is disclosed in EP 1 617 228. The sensor comprises a base part and cover part and the electrical components are connected to a coil housing.

EP 2 083 277 discloses a current sensor which has been designed in order to be easy to manufacture. The current sensor in EP 2 083 277 comprises a magnetic core formed from two parts and with is provided with wall portions such that an air-gap between the magnetic core parts is achieved.

JP 2013179233 discloses another example of a magnetic core for a current sensor which is constituted by a plurality of divided cores. The end portions of the divided cores are provided with an engaging portion such that the parts can be fixedly engaged with each other.

An object of the invention is to provide an electrical current transducer that comprises a split magnetic core mountable around a primary conductor, that is easy to install but also ensures accurate measurement and reliable operation.

It is advantageous to provide an electrical current transducer that achieves specified clearances and creepage distances without increasing the bulk of the transducer.

It is advantageous to provide an electrical current transducer that is compact and economical, in particular that is easy to produce and assemble.

It is advantageous to provide an electrical current transducer that is accurate, easy to implement and economical to use.

It is advantageous to provide an electrical current transducer that is robust and stable.

Objects of the invention have been achieved by providing a current transducer according to claim 1.

Disclosed herein is an electrical current transducer for mounting around a primary electrical conductor carrying a current to be measured, comprising a primary conductor receiving aperture, a housing, a magnetic core mounted in the housing, and a secondary coil wound around a branch of the magnetic core. The housing comprises a major portion and a minor portion, the major portion being separable from the minor portion and configured to be mounted and locked around the primary conductor, the housing major and minor portions being joinable together at joining faces. The magnetic core comprises a major portion mountable in a core receiving cavity of the housing major portion, and a minor portion mountable in a core receiving cavity of the housing minor portion. The housing further comprises an electrical component support body comprising a coil support portion around which the secondary coil is mounted, the secondary coil and coil support portion being received in a first branch receiving portion of the core receiving cavity of the housing major portion. The coil support portion comprises a core receiving cavity comprising a first branch receiving portion receiving a first branch of the magnetic core major portion therein.

In a first aspect of the invention, a longitudinal axis (A) of the magnetic core first branch around which the windings of the secondary coil are mounted, is oriented in a transverse direction to the general direction or plane of the major housing portion joining face. When the minor housing portion is initially moved away from the major housing portion starting from the closed position, the initial direction of movement is thus generally parallel to the direction of the axis of the secondary coil.

In a second aspect of the invention, the electrical component support body forms with the secondary coil, electrical terminals and electrical connection means a single pre-assembled unit insertable into a first branch receiving portion of the core receiving cavity of the housing major portion, the first branch receiving portion extending to the joining face.

The longitudinal axis of the magnetic core first branch is preferably substantially orthogonal to the joining faces.

The electrical component support body advantageously forms with the secondary coil a single pre-assembled unit insertable in the housing major portion.

The magnetic core receiving cavity of the electrical component support body may comprise a third branch receiving portion for receiving a third branch of the magnetic core major portion therein.

In an embodiment, the housing major portion and housing minor portion are coupled together via a pivotable hinge, which may for instance be integrally formed as a single injection molded part. The hinge is advantageously arranged along a face of the housing adjacent a second branch of the magnetic core, distal from the first branch of the magnetic core around which the secondary coil is mounted.

The housing minor portion may advantageously comprise a magnetic core receiving cavity for receiving a fourth branch of the magnetic core therein, the housing minor portion further comprising elastic positioning portions configured to bias the magnetic core minor portion towards the magnetic core major portion.

The magnetic core major portion may advantageously comprise substantially a "U" shape having a first branch connected to a second branch via a third branch the first and second branches having free ends arranged proximal or in abutment against end portions of the magnetic core minor portion when the transducer is in a closed position.

The electrical component support body may advantageously comprise electrical terminals for connection to respective ends of the secondary coil, and further may comprise an integrally formed electrical connector or an electrical connection to an electrical cable for connection to external circuitry for transmission of the measurement signal.

Further objects and advantageous features of the invention will be apparent from the claims, from the detailed description, and annexed drawings, in which:

Referring to the figures, and more particularly to FIGS. 1, 2a, 5a and 5b, an electrical current transducer 2 according to an embodiment of this invention comprises a housing 4, a magnetic core 6a, 6b mounted in the housing, and a secondary coil 10 wound around a branch of the magnetic core 6a, 6b.

In a first variant, the transducer is of a passive current transformer type with soft magnetic core 6 and coil 10.

In a second variant, the current transducer is of the open-loop type and the secondary winding, if present, acts as a pick-up coil that picks up the magnetic field signal circulating in the magnetic core generated by the current flowing in the primary conductor, to measure low frequency and DC currents, a magnetic flux density sensor, e.g. a Hall element, can be placed in a gap formed by decreasing the length of one of the end branches in the U-shaped soft magnetic.

In a third variant, the current transducer is of the closed-loop type and the secondary coil acts a compensation coil driven to cancel the magnetic field signal circulating in the magnetic core generated by the current flowing in the primary conductor. In the second variant, the transducer further comprises a magnetic field detector 8 that may be mounted in an air gap of the magnetic core 6a, 6b. The operation principle of a closed-loop type of current transducer is per se well known in the art, whereby a magnetic field generated by a primary conductor carrying a current to be measured is picked up by the magnetic field detector 8, the signal of the magnetic field detector being processed to generate an electrical current in the secondary coil 10 that seeks to produce an opposing magnetic field cancelling the magnetic field generated by the primary conductor. The electrical current needed to drive the secondary coil to cancel the magnetic field in the magnetic core thus represents an image of the primary current (i.e. is proportional to the primary current to be measured).

The electrical current transducer may, particularly for the closed-loop variant, further comprise a signal processing circuit formed on a circuit board 12 mounted in the housing.

The current transducer may either comprise an electrical connector (not shown) or an electrical connection lead or cable 13 for connection to the measurement signal output of the transducer, and depending on the configuration, to an application signal processing circuit. The connection cable or connector is thus for connection to external circuitry that receives the measurement signal and, depending on the variant, supplies power to the electrical current transducer.

Figure 1:
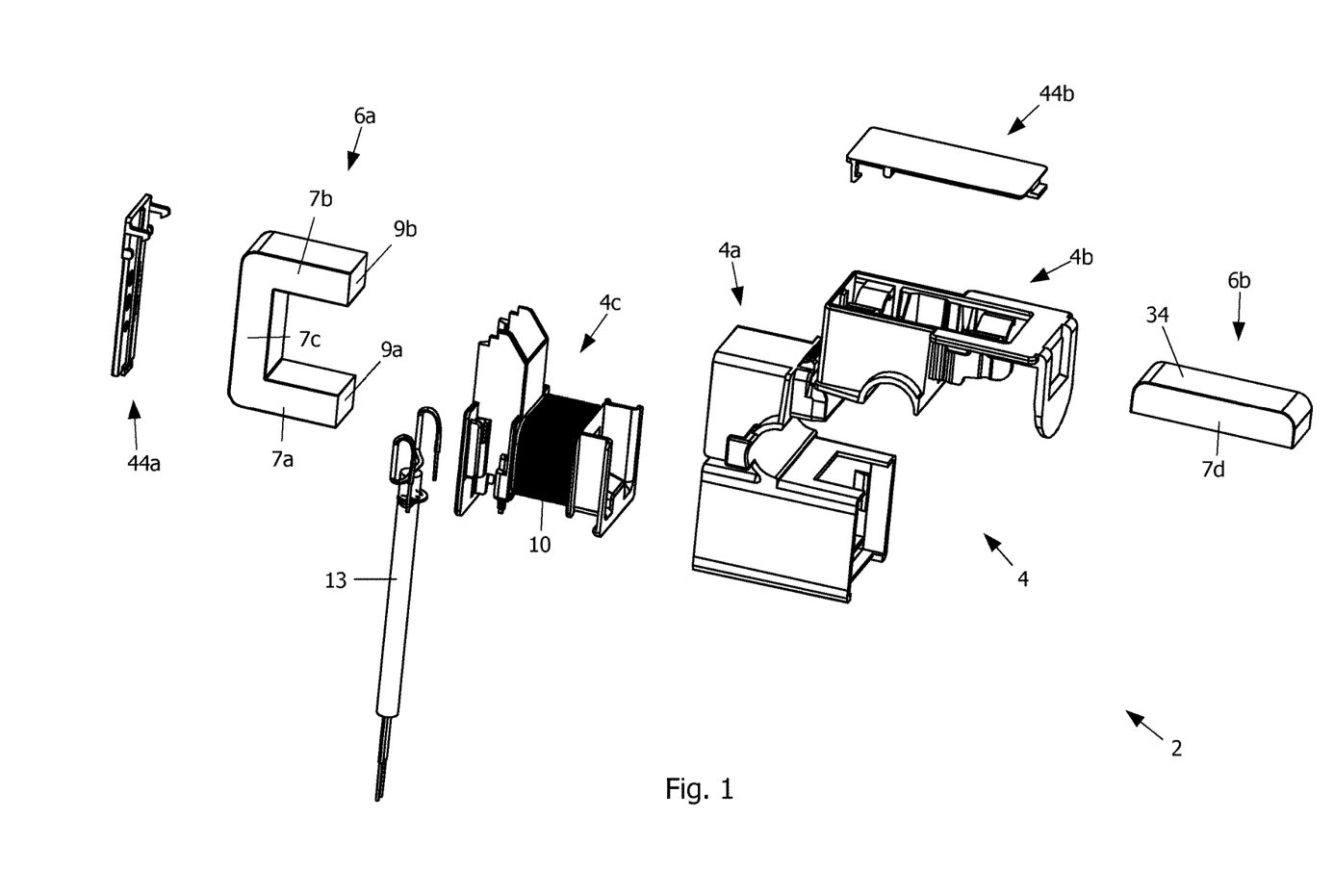
FIG. 1 is a perspective exploded view of an electrical current transducer according to an embodiment of the invention.
Figures 2A, 2D:
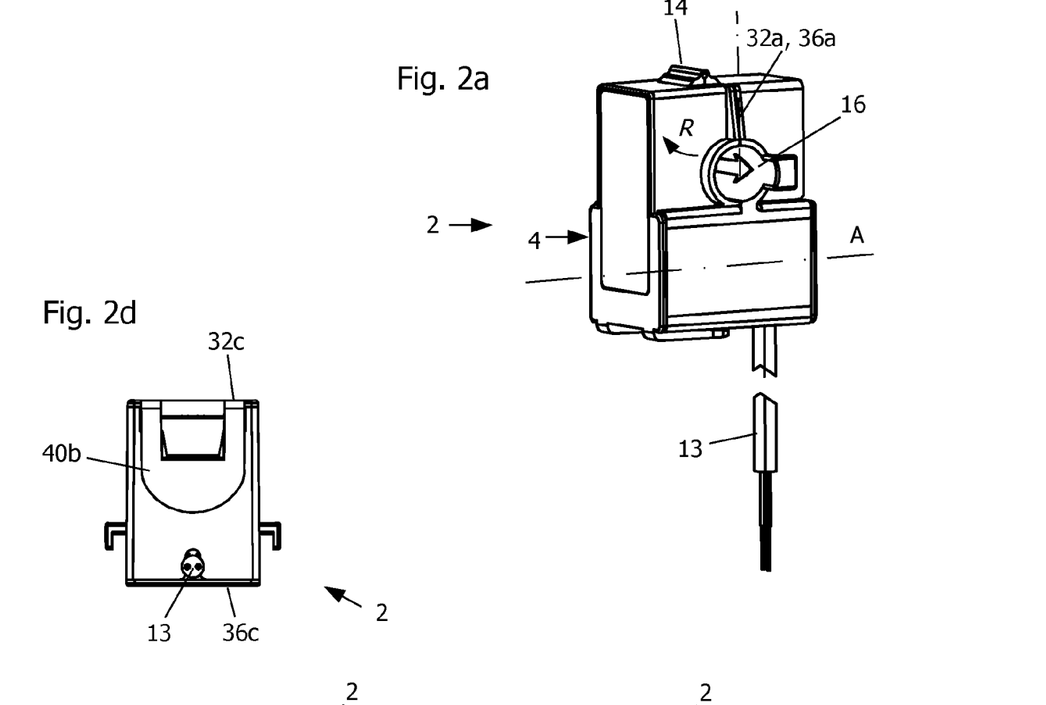
FIG. 2a is a perspective view of an electrical current transducer according to an embodiment of the invention in a closed position.
FIGS. 2b, 2c, and 2d are plan views of the embodiment of FIG. 2a according to the viewing direction of arrows IIb, IIc and IId respectively.
Figure 2B:
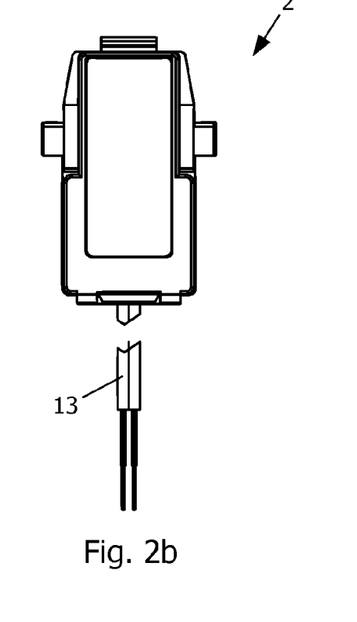
Figure 2C:
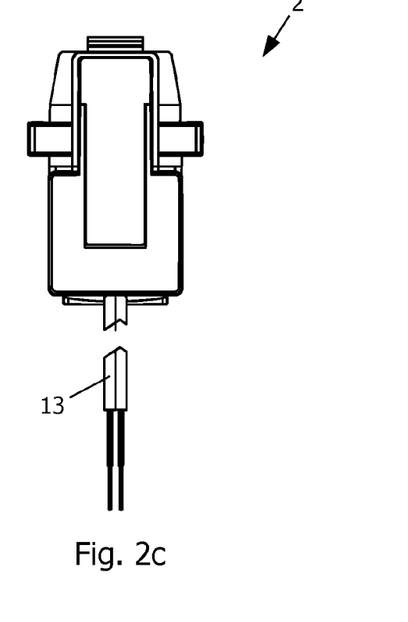
Figure 5A:
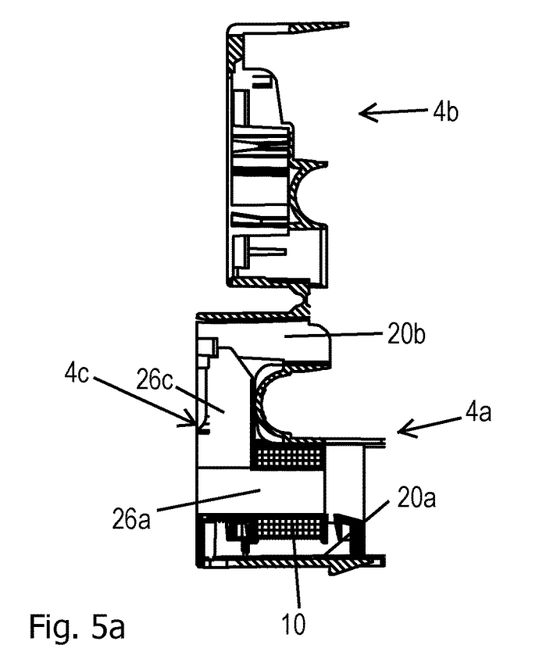
FIGS. 5a and 5b are cross sectional views of an embodiment of the electrical components support body with secondary coil assembled in the housing according to an embodiment of the invention in the open and closed positions respectively.
Figure 5B:
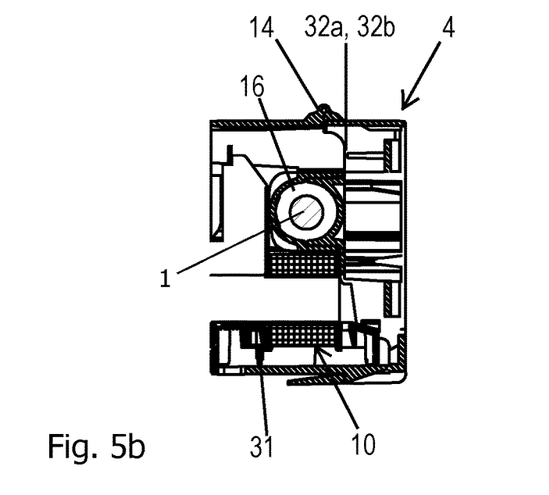

The housing 4 comprises a major portion 4a, a minor portion 4b, and an electrical component support body 4c. The housing has, in a closed position as illustrated in FIG. 2a, a primary conductor receiving aperture 16 extending through a central region of the magnetic core. A primary conductor, which typically may be an electrical cable carrying the current to be measured, can be positioned in the aperture 16 while the major portion 4a and the minor portion 4b of the housing are in an opened position as illustrated in FIGS. 1 and 5a, the major and minor housing positions being configured to be coupled together and secured by fastening means 40a, 40b in a closed position after mounting of the cable in the aperture as shown in FIGS. 2a and 5b. The fastening means may comprise elastic clips, latches, screws, or other known fastening means.

In a preferred embodiment, the major and minor portions of the housing 4 are connected via a pivotable hinge 14, which may advantageously be integrally formed with the minor and major housing portions. The major and minor housing portions and hinge may thus be formed as a single integral injection molded part. Within the scope of the invention other hinges however may be employed for instance by means of an axle engaged in complementary orifices in the housing portions. In a variant, the major and minor housing portions may be separate parts that are not coupled together until they are closed around the primary conductor.

The soft magnetic core 6a, 6b which may be made of a ferrite, or laminated soft iron or other materials with a high magnetic permeability, comprises a major portion 6a received in a core receiving cavity 20 of the housing major portion 4a, and a minor portion 6b received in a core receiving cavity 22 of the housing minor portion 4b. In an advantageous embodiment, the magnetic core major portion 6a may generally have a shape of a "U" including a first branch 7a, a second branch 7b, and a third branch 7c joining the first and second branches at one end, the other ends of the first and second branches being free ends 9a, 9b respectively. The third branch 7c is configured to be distal from a fourth branch 7d of the magnetic core that is received in the core receiving cavity 22 of the housing minor portion 4b. The magnetic core major portion 6a and minor portion 6b are configured to form a magnetic circuit surrounding the aperture in the housing 16 receiving the primary conductor when the transducer is in the closed position.

In a first embodiment, in the closed position, the free ends 9a, 9b of the first and second branches 7a, 7b respectively of the magnetic core are positioned directly adjacent, preferably in an abutting directly contacting manner, opposite ends of the fourth branch 7d of the magnetic core minor portion 6b when the transducer is in the closed position (see FIG. 5b). In this variant the magnetic circuit is closed and the arrangement may act as a current transformer. In other embodiments it is possible to have a magnetic field detector, for example a sensitive magnetic field detector of the fluxgate type, positioned in proximity of a branch of the magnetic core or in an indent formed in a branch of the magnetic core. In the latter variant the secondary coil may be configured as a compensation coil in a closed-loop configuration.

Figure 4A:
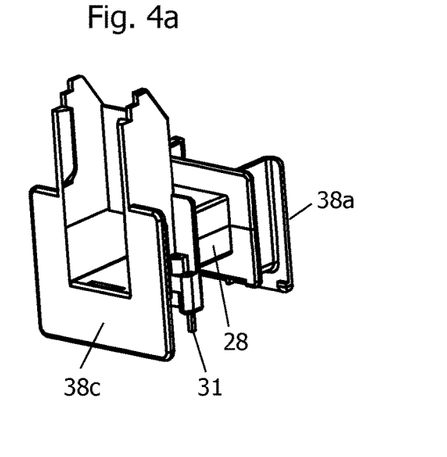
FIGS. 4a, 4b and 4c are perspective views of an electrical components support body of a housing of an electrical current transducer according to an embodiment of this invention.
Figure 4B:
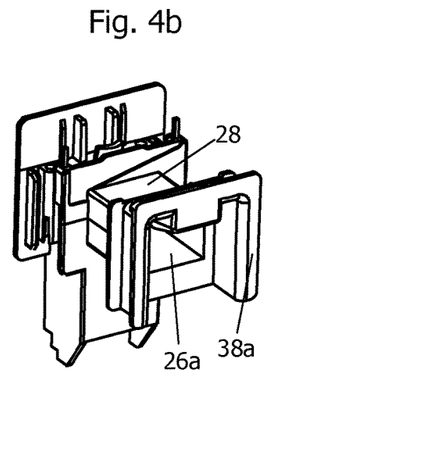
Figure 4C:
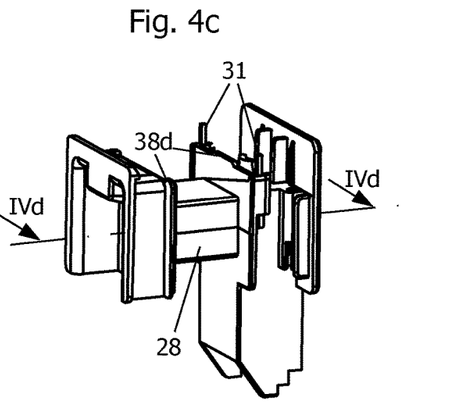
Figure 4D:
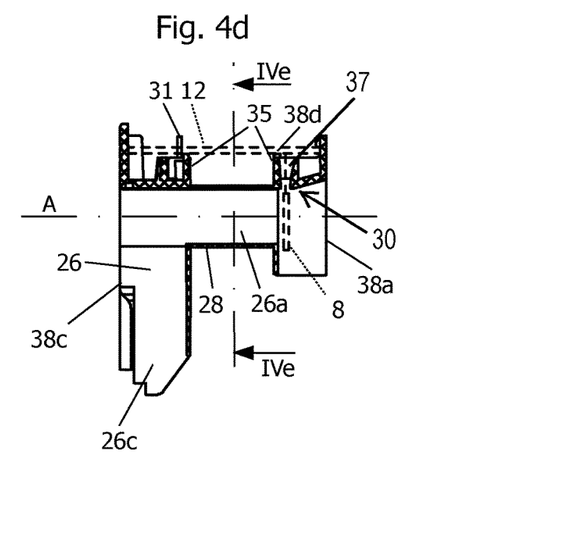
FIG. 4d is a cross sectional view through lines IVd-IVd of FIG. 4c.
Figure 4E:
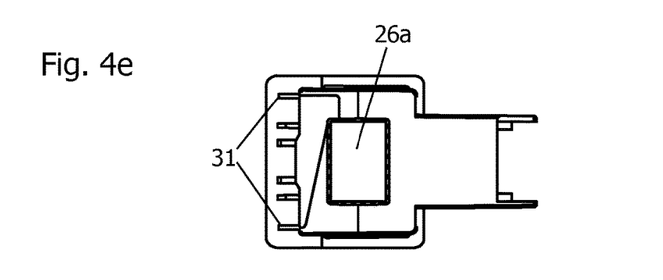
FIG. 4e is a cross sectional view through lines IVe-IVe of FIG. 4d.

In a second embodiment, in the closed position, the free end 9a of the first branch 7a of the magnetic core is separated from an end portion of the fourth branch of the magnetic core by an air gap within which a magnetic field detector 8 is positioned (see FIG. 4d). The free end 9b of the second branch 7b is however positioned directly adjacent, preferably in an abutting directly contacting manner against an opposite end of the fourth branch 7d of the magnetic core 6 when the transducer is in the closed position. The magnetic field detector may be in a form of a Hall effect sensor in a form of an ASIC mounted on or connected to a circuit board 12, as is per se well known in the art. In this embodiment, the air gap may be formed by providing the first branch 7a of the magnetic core with a length shorter than the length of the second branch 7b by an amount equivalent to the length of the air gap.

The minor portion 6b of the magnetic core 6 is, in a preferred embodiment, in the form of a straight bar or beam having a length that spans from over the first branch free end 9a to over the second branch free end 9b. The minor portion may however adopt other shapes than straight, and the major portion of the magnetic core may have a shape other than a "U" shape (for instance a "V" shape) or a semi-circular shape whereby the shape of the minor portion may also adopt a "V" shape, a "U" shape, a semi-circular shape, a polygonal shape or other shapes fulfilling the functional requirement of substantially completely surrounding the primary conductor (except for the air gap within which the magnetic field detector is positioned, depending on the variant).

The housing minor portion 4b advantageously comprises an elastic positioning portion 24 which may for instance be in the form of elastic tongues 24a, 24b integrally formed with side walls 32b of the housing minor portion proximate a top face 32c and configured to elastically bias against an outer face 34 of the magnetic core minor portion 6b to press it towards the free ends 9a, 9b of the magnetic core major portion 6a. The elastic biasing means remove play and ensure an abutting contact between the minor and major portions of the core to improve the magnetic flux conduction in the magnetic circuit. In a variant provided with an air gap, the elastic biasing means ensures provision of a small and defined air gap.

Figures 3A, 3B:
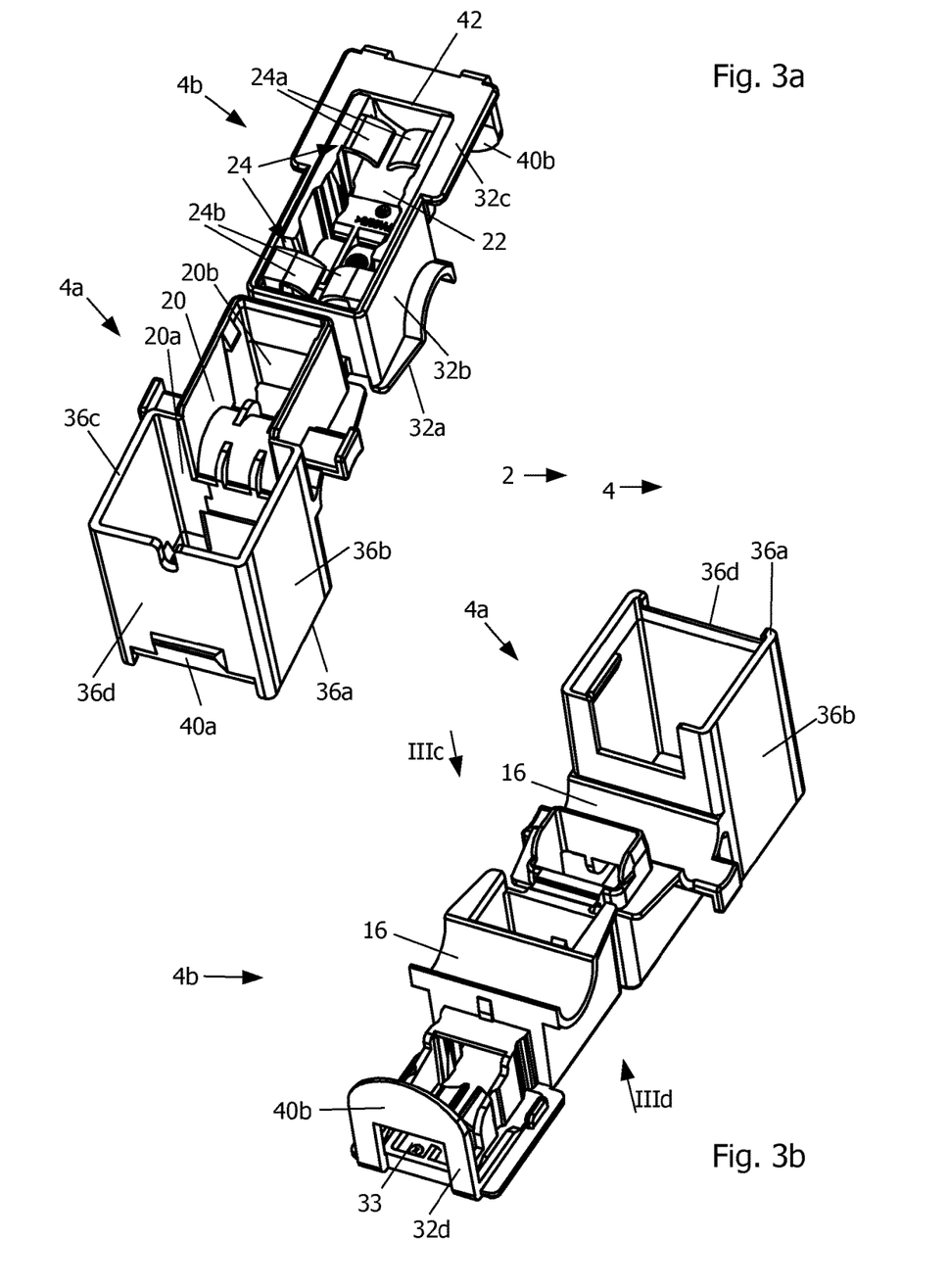
FIGS. 3a and 3b are views in perspective of major and minor housing portions of a housing of an electrical current transducer according to an embodiment of this invention.
Figure 3C:
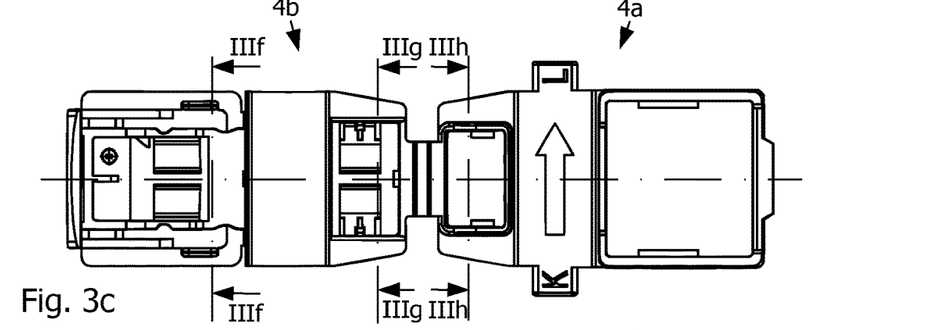
FIGS. 3c and 3d are plan views seen in the direction of arrows IIIc and IIId respectively of the embodiment of FIG. 3b.
Figure 3D:
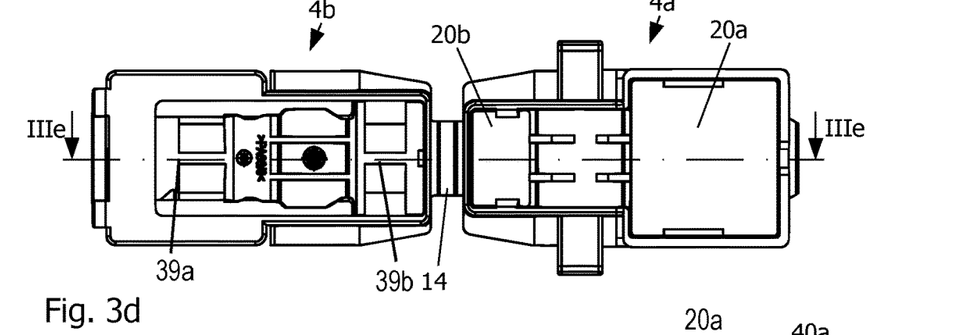
Figure 3E:
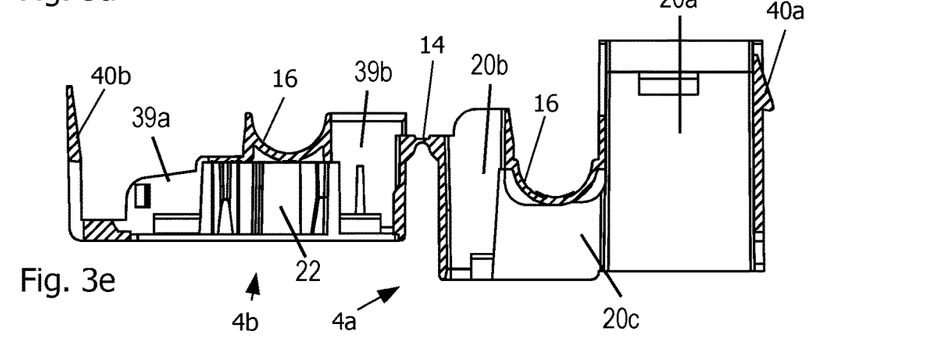
FIG. 3e is a cross sectional view through line IIIe-IIIe of FIG. 3d.
Figure 3F:
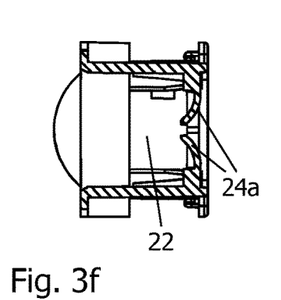
FIGS. 3f, 3g and 3h are cross sectional views through lines IIIf-IIIf, IIIg-IIIg, IIIh-IIIh respectively of FIG. 3c.
Figure 3G:
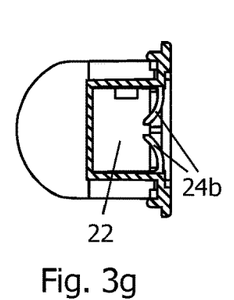
Figure 3H:
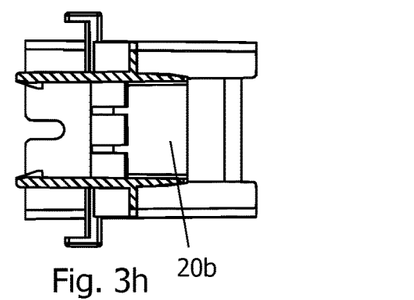

The housing minor portion 4b advantageously comprises an orifice 33 through an end face 32d into which the magnetic core minor portion 6b may be inserted into the magnetic core receiving cavity 22 as best seen in FIG. 3a and FIG. 3b. The orifice 33 may advantageously be closed by an end wall 36d of the housing major portion 4a when the transducer is in the closed position. The minor portion 6b of the magnetic core can thus be simply and easily assembled in the housing in a secure and well protected manner, while also adopting an accurate position in the housing to well define the magnetic properties of the magnetic circuit and the accuracy of the transducer.

The electrical components support body 4c of the housing 4 very advantageously fulfills the function of mounting and electrical connection of the secondary coil and the assembly thereof within the housing major portion 4a in a simple, easy and cost effective manner. In a preferred embodiment, the electrical components body 4c may further fulfill the function of support and connection of all other electrical components of the current transducer, such as the connector or cable for connection to external circuitry, the magnetic field detector (if present—depends on the variant), and a signal processing circuit (if present—depends on the variant). The connector (not shown in the illustrated embodiment) or cable is configured to transmit the measurement signal to external circuitry, and depending on the variant, also supplies power to the electrical current transducer.

The electrical component support body 4c is assembled substantially against a bottom face 36c of the housing major portion with the secondary coil 10 being inserted into the core receiving cavity 20 such that a top end 38a of the electrical component support body 4c is positioned at or proximal the top end 36a of the housing major portion 4a.

The electrical component support body 4c comprises a coil support portion 28 extending along an axis A aligned with the magnetic core first branch 7a and comprising a first branch receiving cavity 26a extending therethrough. The secondary coil 10 is wound around the coil support portion 28 and each end of the coil is connected to electrical terminals 31. In the illustrated example, the terminals are the in the form of electrical pin terminals 31 fixed to the electrical component support body 4c, for instance by stitching or by overmolding or by other known mounting techniques. The coil support portion 28 is flanked on either axial end by flanges 35 defining the length of the coil.

A circuit board 12 may advantageously be mounted against an end face 38d of the electrical component support body 4c spanning over and along the length of the secondary coil 10. The circuit board may comprise circuit traces to interconnect the secondary coil to electrical connection means (connector or cable). An electrical connector (not shown in the illustrated embodiments) may be mounted on the circuit board, or integrally formed with the body 4c, and connected to circuit traces on the circuit board. The circuit board may further comprise a signal processing circuit. In the embodiment illustrated in FIG. 4d, the circuit board is connected on one side to the terminals 31 and on the other side to the magnetic field detector 8 mounted thereon, the magnetic field detector being inserted through a slot 37 in the end face 38d. The magnetic field detector 8 is thus positioned over the free end 9a of the first branch 7a of the magnetic core 6 and thus in the air gap formed between said free end and an end portion of the fourth branch 7d when the transducer is in the closed position.

The secondary coil, electrical terminals for the coil and electrical connection means for connection to external circuitry, as well as any other electrical components (depending on the variant/configuration) can thus be assembled and connected to form with the electrical component support body 4c a single pre-assembled module. The pre-assembled module is then assembled to the housing major portion 4a by a simple insertion and fixing arrangement, for instance by latching means, welding or bonding. The magnetic core major portion 6a can be simply inserted into the core receiving cavities 26, 20. The first branch 7a and third branch 7c are lodged in the first branch receiving portion 26a and third branch receiving portion 26c respectively of the electrical component support body 4c, and the second branch 7b is lodged in the first branch receiving portion 20a of the and housing major portion 4a.

It may be noted that the housing minor portion 4b comprises openings 39a, 39b in the joining face 32a facing the magnetic core major portion ends 9a, 9b configured to allow end portions of the magnetic core minor portion 6b to be positioned in contact with or, if there is an airgap configured, as close as desired to magnetic core major portion free ends 9a, 9b.

One of the advantageous aspects of the configuration illustrated, is the disposition of the secondary coil along one of the upstanding branches 7a of the U-shaped magnetic core major portion 6a, rather than positioning the coil on the magnetic core branch joining the upstanding branches. In this configuration the joining face 36a of the major housing portion is generally transverse, more particularly generally perpendicular, to the axis A of the secondary coil, whereas in conventional devices the general plane separating the two housing parts is parallel to the axis of the coil. Said otherwise, in the present invention the initial direction of movement (in the case of a pivotable hinge connection the tangent of initial opening movement) R of the housing minor portion from the closed position to the open position is generally parallel to the coil axis A, whereas in conventional devices the coil axis is generally orthogonal to the initial housing separation movement.

The invention configuration reduces the height of the electrical current transducer defined between the top face 32a and bottom face 36a. This arrangement is also particularly advantageous, independently of the lower height, for mounting the signal processing circuit and the magnetic field detector within the housing in an accurate, robust and cost effective manner, in particular with respect to the magnetic core. A further advantageous aspect of the illustrated embodiment is that the primary conductor is well separated from the magnetic core thus ensuring good electrical creepage resistance.

Mounting of the secondary coil around a magnetic core branch that extends essentially perpendicular to the joining faces 32a, 36a between the housing major and minor portions is thus a particularly advantageous configuration for many applications, offering easy assembly, accurate positioning of the magnetic core and as the case may be, the magnetic field detector, and further providing a low transducer height.

After assembly of the magnetic core in the housing, top and bottom lids 44b, 44a may be provided to close the orifices 42b, 42a in the top and bottom faces of the housing. In a variant, either or both of the lids may comprise elastic biasing means to push against the magnetic core to remove play and accurately position the magnetic core portions within the housing and with respect to each other.

The housing major portion, in particular around the electrical component support body and electrical components mounted therein may optionally be filled with a potting material.

LIST OF REFERENCES USED primary conductor 1
electric current transducer 2
    housing 4
        major portion 4a
            magnetic core receiving cavity 20
                first branch receiving portion 20a
                second branch receiving portion 20b
                third branch receiving portion 20c
            joining face 36a
            side face/walls 36b
            top face 36c
            end wall 36d
            fastening means (latch) 40a
        minor portion 4b magnetic core receiving cavity 22
　elastic positioning portion 24
　　elastic tongues 24*a*, 24*b*
　joining face 32*a*
　　openings 39*a*, 39*b*
　side walls 32*b*
　bottom face 32*c*
　end face 32*d*
　　orifice 33
　fastening means (latch) 40*b*
electrical components support body 4*c*
　magnetic core receiving cavity 26
　　first core branch receiving portion 26*a*
　　third branch receiving portion 26*c*
　coil support portion 28
　　flanges 35
　magnetic field detector support portion 30
　　slot 37
　electrical terminals 31
　top face 38*a*
　bottom face 38*c*
　end face 38*d*
　top lid 44*b*
　bottom lid 44*a*
hinge 14
primary conductor receiving aperture 16
magnetic core 6*a*, 6*b*
　major portion 6*a*
　　first branch 7*a*
　　　free end 9*a*
　　second branch 7*b*
　　　free end 9*b*
　　third branch 7*c*
　minor portion 6*b*
　　fourth branch 7*d*
　　　outer face 34
　central passage
　magnetic circuit gap
magnetic field detector 8
secondary coil 10
circuit board 12
electrical connection (cable, lead) 13

The invention claimed is:

1. Electrical current transducer for mounting around an electrical primary conductor comprising a primary conductor receiving aperture, a housing, a magnetic core mounted in the housing, and a secondary coil wound around a branch of the magnetic core, the housing comprising a major portion and a minor portion, the major portion being separable from the minor portion and configured to be mounted and locked around the primary conductor, wherein the housing in a closed position has a primary conductor aperture extending through a central region of the magnetic core such that a primary conductor can be positioned in said aperture while the major portion and the minor portion of the housing are in an opened position, whereby the housing and the magnetic core can be split open to allow mounting and closing of the transducer around a primary conductor, the housing major and minor portions joinable together at joining faces, the magnetic core comprising a major portion mountable in a core receiving cavity of the housing major portion, and a minor portion mountable in a core receiving cavity of the housing minor portion, characterized in that the housing further comprises an electrical component support body comprising a coil support portion around which the secondary coil is mounted, the secondary coil and coil support portion being received in a first branch receiving portion of the core receiving cavity of the housing major portion, the coil support portion comprising a core receiving cavity comprising a first branch receiving portion receiving a first branch of the magnetic core major portion therein, a longitudinal axis (A) of the magnetic core first branch being in a transverse direction to the joining faces, wherein the housing major portion and housing minor portion are coupled together via a pivotable hinge and wherein the housing major portion and minor portion and hinge are integrally formed as a single injection molded part.

2. Electrical current transducer for mounting around an electrical primary conductor carrying a current to be measured, comprising a primary conductor receiving aperture, a housing, a magnetic core mounted in the housing, and a secondary coil wound around a branch of the magnetic core, the housing comprising a major portion and a minor portion, the major portion being separable from the minor portion and configured to be mounted and locked around the primary conductor, the housing major and minor portions joinable together at joining faces, the magnetic core comprising a major portion mountable in a core receiving cavity of the housing major portion, and a minor portion mountable in a core receiving cavity of the housing minor portion, characterized in that the housing further comprises an electrical component support body comprising a coil support portion around which the secondary coil is mounted, electrical terminals connected to respective ends of the secondary coil, and electrical connection means for connection to external circuitry, wherein the electrical component support body forms with the secondary coil, electrical terminals and electrical connection means a single pre-assembled unit insertable into a first branch receiving portion of the core receiving cavity of the housing major portion, wherein the housing major portion and housing minor portion are coupled together via a pivotable hinge and wherein the housing major and minor portion and hinge are integrally formed as a single injection molded part.

3. Current transducer according to claim 1, wherein the electrical component support body forms with the secondary coil a single pre-assembled unit.

4. Current transducer according to claim 1, wherein the hinge is arranged along a face of the housing adjacent a second branch of the magnetic core, distal from the first branch of the magnetic core around which the secondary coil is mounted.

5. Current transducer according to claim 1, wherein the housing minor portion comprises a magnetic core receiving cavity for receiving a fourth branch of the magnetic core therein, the housing minor portion further comprising elastic positioning portions configured to bias the magnetic core minor portion towards the magnetic core major portion.

6. Current transducer according to claim 1, wherein the magnetic core major portion comprises substantially a "U" shape having a first branch connected to a second branch via a third branch the first and second branches having free ends arranged proximal or in abutment against end portions of the magnetic core minor portion when the transducer is in a closed position.

7. Current transducer according to claim 1, wherein the electrical component support body comprises an integrally formed electrical connector or an electrical connection to an electrical cable for connection to external circuitry for transmission of the measurement signal.

8. Current transducer according to claim 2, wherein the coil support portion comprises a core receiving cavity comprising a first branch receiving portion receiving a first branch of the magnetic core major portion therein, a longitudinal axis (A) of the magnetic core first branch being in a traverse direction to the joining faces.

9. Current transducer according to claim 2, wherein said longitudinal axis of the magnetic core first branch is substantially orthogonal to the said joining faces.

10. Current transducer according to claim 2, wherein the magnetic core receiving cavity of the electrical component support body comprises a third branch receiving portion for receiving a third branch of the magnetic core major portion therein.

11. Current transducer according to claim 2, wherein the hinge is arranged along a face of the housing adjacent a second branch of the magnetic core, distal from the first branch of the magnetic core around which the secondary coil is mounted.

12. Current transducer according to claim 2, wherein the housing minor portion comprises a magnetic core receiving cavity for receiving a fourth branch of the magnetic core therein, the housing minor portion further comprising elastic positioning portions configured to bias the magnetic core minor portion towards the magnetic core major portion.

13. Current transducer according to claim 2, wherein the magnetic core major portion comprises substantially a "U" shape having a first branch connected to a second branch via a third branch the first and second branches having free ends arranged in abutment against end portions of the magnetic core minor portion when the transducer is in a closed position.

14. Current transducer according to claim 2, wherein the electrical component support body comprises an integrally formed electrical connector or an electrical connection to an electrical cable for connection to external circuitry for transmission of the measurement signal.

* * * * *